(12) United States Patent
Uemae et al.

(10) Patent No.: US 9,555,436 B2
(45) Date of Patent: Jan. 31, 2017

(54) SUBSTRATE TREATING APPARATUS AND SUBSTRATE TREATMENT METHOD FOR DISCHARGING TREATMENT SOLUTION FROM NOZZLE TO SUBSTRATE

(71) Applicant: SCREEN Holdings Co., Ltd., Kyoto (JP)

(72) Inventors: Shoji Uemae, Kyoto (JP); Tatsuhiko Kawaguchi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 14/854,235

(22) Filed: Sep. 15, 2015

(65) Prior Publication Data

US 2016/0089688 A1 Mar. 31, 2016

(30) Foreign Application Priority Data

Sep. 26, 2014 (JP) ................. 2014-196826

(51) Int. Cl.
*B05C 11/00* (2006.01)
*B05D 3/00* (2006.01)
*B05D 1/02* (2006.01)
*B05C 11/10* (2006.01)
*B05B 3/00* (2006.01)

(52) U.S. Cl.
CPC ............. *B05C 11/1005* (2013.01); *B05B 3/00* (2013.01); *B05C 11/1039* (2013.01); *B05D 1/02* (2013.01)

(58) Field of Classification Search
None
See application file for complete search history.

(56) References Cited

U.S. PATENT DOCUMENTS

| | | | | |
|---|---|---|---|---|
| 4,998,502 A * | 3/1991 | Schucker | ............. | B01F 5/0615 118/302 |
| 5,782,978 A * | 7/1998 | Kinose | .................... | B05C 11/08 118/319 |
| 5,843,527 A * | 12/1998 | Sanada | .................... | B05C 11/08 427/240 |
| 6,680,078 B2 * | 1/2004 | Davlin | .................... | G03F 7/162 118/320 |

(Continued)

FOREIGN PATENT DOCUMENTS

| JP | 11-329936 | 11/1999 |
|---|---|---|
| JP | 2015-173148 | 10/2015 |
| JP | 2015-173204 | 10/2015 |

*Primary Examiner* — Allan Olsen
(74) *Attorney, Agent, or Firm* — Ostrolenk Faber LLP

(57) ABSTRACT

An upper treatment solution nozzle discharges a treatment solution at a treatment position above a substrate. A reference image and a test image are cut out from an image captured after the upper treatment solution nozzle receives an instruction to start discharging the treatment solution. The test image is an image including an area of a surface of a substrate, in which a liquid flow of the treatment solution from the upper treatment solution nozzle is to be formed. The reference image is an image of an area of the surface of the substrate except for the area in which the liquid flow of the treatment solution from the upper treatment solution nozzle is to be formed. Through the comparison between the reference image and the test image, a discharge of the treatment solution from the upper treatment solution nozzle is determined.

3 Claims, 8 Drawing Sheets

(56) References Cited

U.S. PATENT DOCUMENTS

| | | | | |
|---|---|---|---|---|
| 8,887,657 B2* | 11/2014 | Ooshiro | ............... | B05C 5/0291 |
| | | | | 118/300 |
| 2002/0043214 A1* | 4/2002 | Inada | .................... | G03F 7/162 |
| | | | | 118/668 |
| 2002/0124798 A1* | 9/2002 | Kitano | ..................... | G03F 7/16 |
| | | | | 118/300 |
| 2005/0026455 A1* | 2/2005 | Hamada | ................... | C23F 1/18 |
| | | | | 438/782 |
| 2006/0029388 A1* | 2/2006 | Terada | ............. | H01L 21/67253 |
| | | | | 396/611 |
| 2007/0199579 A1* | 8/2007 | Hayasaki | ......... | H01L 21/67051 |
| | | | | 134/2 |
| 2010/0098869 A1* | 4/2010 | Kinoshita | ............... | B05B 12/08 |
| | | | | 427/421.1 |
| 2011/0286738 A1* | 11/2011 | Noda | ............... | H01L 21/67253 |
| | | | | 396/611 |
| 2013/0084393 A1* | 4/2013 | Kashiyama | ........ | H01L 21/6715 |
| | | | | 427/273 |
| 2014/0124479 A1* | 5/2014 | Tomita | ............. | H01L 21/02087 |
| | | | | 216/85 |
| 2015/0262848 A1 | 9/2015 | Sano et al. | | |

\* cited by examiner

SUBSTRATE TREATING APPARATUS AND SUBSTRATE TREATMENT METHOD FOR DISCHARGING TREATMENT SOLUTION FROM NOZZLE TO SUBSTRATE

BACKGROUND OF THE INVENTION

Field of the Invention

The present invention relates to a substrate treating apparatus and a substrate treatment method for discharging a treatment solution from a nozzle to a thin-plate microelectronic substrate (hereinafter, merely referred to as a "substrate") such as a semiconductor wafer and a glass substrate for liquid crystal display to perform a predetermined treatment.

Description of Background Art

In the conventional process of manufacturing a semiconductor device or the like, substrate treatments such as a cleaning treatment and a resist coating treatment are performed by supplying a substrate with various treatment solutions such as deionized water, a photoresist solution, and an etching solution. Widely used as an apparatus that performs the solution treatment using such treatment solutions is a substrate treating apparatus that discharges a treatment solution to the surface of a substrate from a nozzle while horizontally rotating the substrate.

Such a substrate treating apparatus checks whether the treatment solution is discharged from the nozzle by checking an output of a flowmeter or the operation of a pump. As means for determining the presence or absence of a discharge more reliably, for example, Japanese Patent Application Laid-Open No. 11-329936 (1999) proposes that imaging means such as CCD camera, provided in a substrate treating apparatus, directly monitors a discharge of a treatment solution from a nozzle.

When imaging means directly monitors a discharge of a treatment solution from a nozzle, the background during imaging varies depending on the type of a to-be-treated substrate. In typical cases, a pattern is formed on the surface of a substrate by depositing various films such as a resist film and an insulating film thereon. The reflectance of the surface of the substrate varies greatly depending on the type of such a film or the formed pattern, which may result in a different background during imaging depending on the type of a to-be-treated substrate. If the same type of film is formed, in the etching treatment with, for example, hydrofluoric acid, the corrosion of the film may progress with a lapse of treatment time, changing the reflectance of the surface of the substrate. This increases the noise of an image captured by imaging means due to various factors such as the type of a film deposited on the substrate surface, the formed pattern, and the details of the treatment, so that a discharge of the treatment solution from the nozzle cannot be detected accurately.

SUMMARY OF THE INVENTION

The present invention is directed to a substrate treating apparatus that discharges a treatment solution to a substrate.

In an aspect of the present invention, a substrate treating apparatus includes a substrate holder that holds a substrate; a cup surrounding the substrate holder; a nozzle that discharges a treatment solution; a drive part that moves the nozzle between a treatment position above the substrate held on the substrate holder and a standby position outside the cup; an image acquiring part that cuts out a test image and a first reference image, from an image obtained by the imaging part imaging the imaging area after the nozzle receives an instruction to start discharging the treatment solution, the test image being an image including the area of the surface of the substrate held on the substrate holder in which the liquid flow is to be formed, the first reference image being an image of the surface of the substrate except for the area; and a determination part that compares the first reference image and the test image to determine a discharge of the treatment solution from the nozzle.

The first reference image and the test image are acquired at the same timing for the same substrate, enabling reliable detection of a discharge of the treatment solution from the nozzle independent of the type of the to-be-treated substrate and the details of the treatment.

Preferably, the image acquiring part further cuts out, from the image acquired by the imaging part, a second reference image of an area of the surface of the substrate held on the substrate holder except for the area in which the liquid flow is to be formed, the second reference image differing from the first reference image. The determination part compares the first reference image and the second reference image to determine the validity of a discharge of the treatment solution.

The accuracy of detecting a discharge of the treatment solution from the nozzle can be increased.

The present invention is also directed to a substrate treatment method for discharging a treatment solution to a substrate.

In another aspect of the present invention, a substrate treatment method includes the steps of (a) holding a to-be-newly-treated substrate on a substrate holder; (b) moving, after the to-be-newly-treated substrate is held on the substrate holder, a nozzle that discharges a treatment solution from a standby position outside a cup surrounding the substrate holder toward a treatment position above the substrate held on the substrate holder; (c) imaging, after the nozzle receives an instruction to start discharging the treatment solution, an imaging area including an area in which a liquid flow is to be formed when the nozzle discharges the treatment solution at the treatment position; (d) cutting out, from an image acquired in the step (c), a test image and a first reference image, the test image being an image including the area of the surface of the substrate held on the substrate holder in which the liquid flow is to be formed, the first reference image being an image of the surface of the substrate except for the area; and (e) comparing the first reference image and the test image to determine a discharge of the treatment solution from the nozzle.

The first reference image and the test image are acquired at the same timing for the same substrate, enabling reliable detection of a discharge of the treatment solution from the nozzle independent of the type of a to-be-treated substrate and the details of the treatment.

Preferably, the step (d) further cuts out, from the image acquired in the step (c), a second reference image of an area of the surface of the substrate held on the substrate holder except for the area in which the liquid flow is to be formed, the second reference image differing from the first reference image. The step (e) compares the first reference image and the second reference image to determine the validity of a discharge of the treatment solution.

The accuracy of detecting a discharge of the treatment solution from the nozzle can be increased.

The present invention therefore has an object to reliably detect a discharge of a treatment solution from a nozzle.

These and other objects, features, aspects and advantages of the present invention will become more apparent from the following detailed description of the present invention when taken in conjunction with the accompanying drawings.

DESCRIPTION OF EMBODIMENTS

The following describes embodiments of the present invention with reference to the drawings.

First Embodiment

Figure 1:
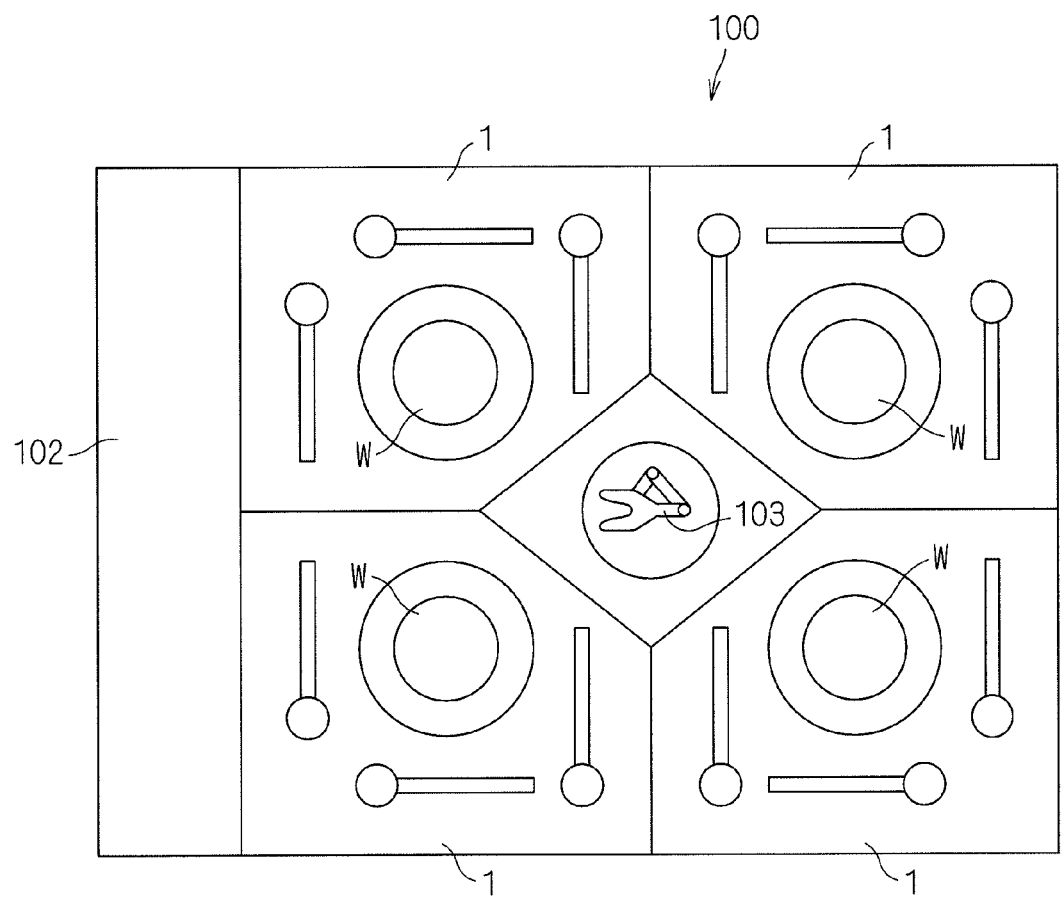
FIG. 1 shows an overall configuration of a substrate treating apparatus according to the present invention.

FIG. 1 shows the overall configuration of a substrate treating apparatus 100 according to the present invention. The substrate treating apparatus 100, which is a single wafer type apparatus that treats one substrate W at one time, performs a liquid treatment on the circular substrate W made of silicon using chemical solutions and deionized water, and then, performs a drying treatment on the substrate W. The typical chemical solutions may be an SC1 solution (a mixture of ammonia water, aqueous hydrogen peroxide, and water), an SC2 solution (a mixture of hydrochloric acid, aqueous hydrogen peroxide, and water), and a DHF solution (dilute hydrofluoric acid). In this specification, chemical solutions and deionized water are collectively referred to as "treatment solutions." The treatment solutions of the present invention include an application liquid such as a photoresist solution for deposition as well as cleaning, a chemical solution for removing an unnecessary film, and a chemical solution for etching (such as hydrogen fluoride).

The substrate treating apparatus 100 includes an indexer 102, a plurality of treatment units 1, and a main transfer robot 103. The indexer 102 has a function of carrying an untreated substrate W received from the outside the apparatus into the apparatus and carrying out the treated substrate W subjected to the treatment out of the apparatus. The indexer 102 mounts a plurality of carriers thereon and includes a transfer robot (which are not shown). The carrier may be a known front opening unified pod (FOUP) or a standard mechanical interface (SMIF) pod that accommodates the substrate W in an enclosed space, or an open cassette (OC) that exposes the accommodated substrate W to the outside air. The transfer robot transfers the substrate W between the carrier and the main transfer robot 103.

The substrate treating apparatus 100 includes 12 treatment units 1 arranged therein. As to their detailed arrangement, four towers, each of which includes three layered treatment units 1, are arranged so as to surround the main transfer robot 103. In other words, four treatment units 1 arranged while surrounding the main transfer robot 103 are layered in three stages. FIG. 1 shows one layer of them. The number of treatment units 1 mounted in the substrate treating apparatus 100 is not limited to 12 and may be, for example, eight or four.

The main transfer robot 103 is placed at the center of the four towers including the layered treatment units 1. The main transfer robot 103 carries the untreated substrate W received from the indexer 102 into each treatment unit 1, and also carriers the treated substrate W out of each treatment unit 1 and delivers the substrate W to the indexer 102.

Figure 2:
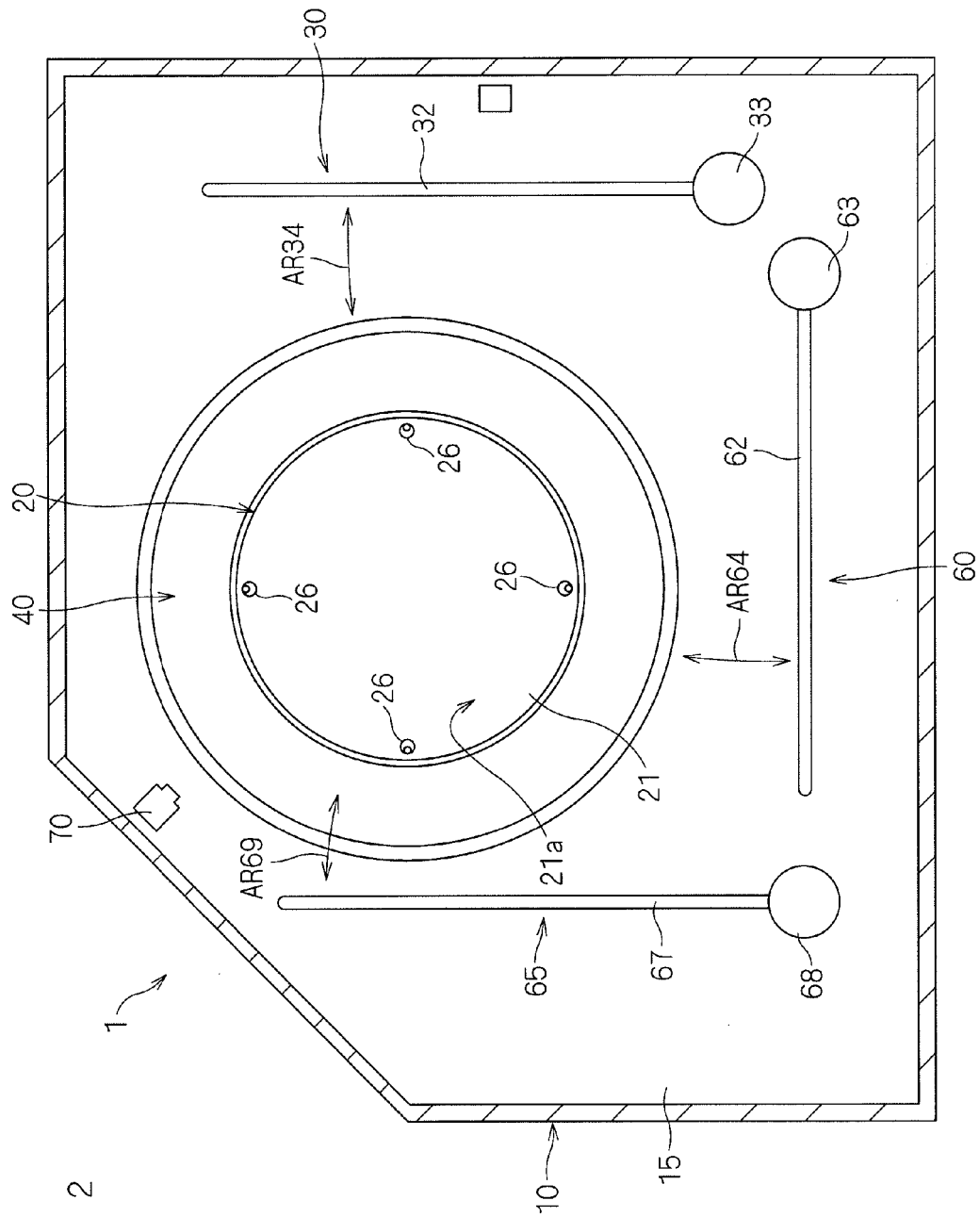
FIG. 2 is a plan view of a treatment unit.
Figure 3:
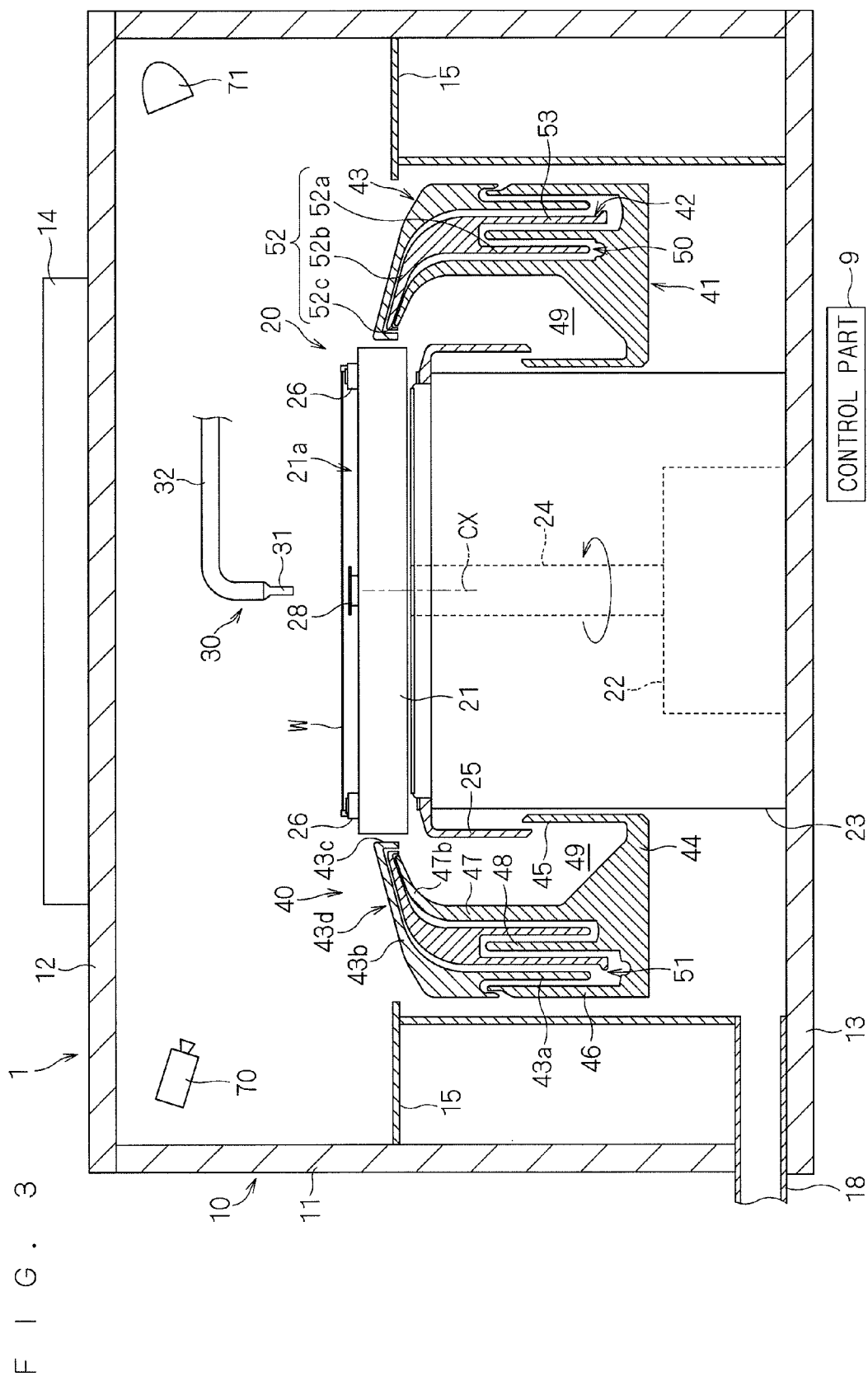
FIG. 3 is a vertical cross-sectional view of the treatment unit.

Next, the treatment unit 1 is described. Although the following describes one of the 12 treatment units 1 mounted in the substrate treating apparatus 100, the same holds true for the other treatment units 1. FIG. 2 is a plan view of the treatment unit 1. FIG. 3 is a vertical cross-sectional view of the treatment unit 1. FIG. 2 shows the state in which the spin chuck 20 does not hold the substrate W, and FIG. 3 shows the state in which the spin chuck 20 holds the substrate W.

The treatment unit 1 includes as main components, in the chamber 10, the spin chuck 20 that holds the substrate W in a horizontal position (a position in which a normal extends vertically), three upper treatment solution nozzles 30, 60, and 65 for supplying a treatment solution to the upper surface of the substrate W held on the spin chuck 20, a treatment cup 40 surrounding the spin chuck 20, and a camera 70 that images the space above the spin chuck 20. Around the treatment cup 40 in the chamber 10 is provided a divider 15 dividing the inner space of the chamber 10 into upper and lower portions.

The chamber 10 includes a side wall 11 extending vertically, a ceiling wall 12 blocking the upper portion of the space surrounded by the side wall 11, and a floor wall 13 blocking the lower portion of the space. The space surrounded by the side wall 11, the ceiling wall 12, and the floor wall 13 is the treatment space for the substrate W. A part of the side wall 11 of the chamber 10 is provided with a carry-in entrance for carrying the substrate W into and out of the chamber 10 by the main transfer robot 103, and a shutter that opens/closes the carry-in entrance (which are not shown).

The ceiling wall 12 of the chamber 10 is equipped with a fan filter unit (FFU) 14 for further cleaning the air in the clean room in which the substrate treating apparatus 100 is placed and then supplies the air to the treatment space of the chamber 10. The fan filter unit 14 includes a fan and a filter (such as a HEPA filter) for taking in the air in the clean room and sending out the air to the chamber 10, and creates a downflow of the cleaned air in the treatment space of the chamber 10. To uniformly disperse the cleaned air supplied from the fan filter unit 14, a punching plate having a large number of blowing holes drilled therein may be provided directly below the ceiling wall 12.

The spin chuck 20 includes a disc-shaped spin base 21 fixed in a horizontal position to the upper end of a rotating shaft 24 extending vertically. Below the spin base 21 is provided a spin motor 22 that causes the rotating shaft 24 to rotate. The spin motor 22 causes the spin base 21 to rotate in a horizontal plane via the rotating shaft 24. A cylindrical cover member 23 is provided so as to surround the spin motor 22 and the rotating shaft 24.

The disc-shaped spin base 21 has an outside diameter slightly larger than the diameter of the circular substrate W held on the spin chuck 20. The spin base 21 accordingly has a holding surface 21a facing the entire lower surface of the substrate W to be held.

A plurality of (in this embodiment, four) chuck pins 26 are vertically arranged on the periphery of the holding surface 21a of the spin base 21. The plurality of chuck pins 26 are equidistantly (for four chuck pins 26 as in this embodiment, at intervals of) 90° arranged on the circumference corresponding to the peripheral circle of the circular substrate W. The plurality of chuck pins 26 are driven together by a link mechanism (not shown) accommodated in the spin base 21. The spin chuck 20 causes each of the plurality of chuck pins 26 to abut the peripheral edge of the substrate W to grip the substrate W, thereby holding the substrate W in a horizontal position close to the holding surface 21a above the spin base 21 (see FIG. 3) and moving away each of the plurality of chuck pins 26 from the peripheral edge of the substrate W to release the grip.

The cover member 23 covering the spin motor 22 has a lower end fixed to the floor wall 13 of the chamber 10 and an upper end reaching the portion up to directly below the spin base 21. The upper-end portion of the cover member 23 is provided with a flange member 25 outwardly projecting almost horizontally from the cover member 23 and extending downwardly while bending. While the spin chuck 20 holds the substrate W through gripping by a plurality of chuck pins 26, the spin motor 22 causes the rotating shaft 24 to rotate, causing the substrate W to rotate about a rotational axis CX passing through the center of the substrate W and extending vertically. Driving of the spin motor 22 is controlled by the control part 9.

The upper treatment solution nozzle 30 includes a discharge head 31 attached to the distal end of the nozzle arm 32. The proximal end of the nozzle arm 32 is fixed and connected to a nozzle pedestal 33. The nozzle pedestal 33 can pivot about the axis extending vertically by a motor (not shown). Pivoting of the nozzle pedestal 33 causes the upper treatment solution nozzle 30 to move horizontally in an arc shape between the treatment position above the substrate W held on the spin chuck 20 and the standby position outside the treatment cup 40, as indicated by an arrow AR34 of FIG. 2. The upper treatment solution nozzle 30 is configured to be supplied with a plurality of treatment solutions (at least including deionized water). The treatment solution discharged from the discharge head 31 of the upper treatment solution nozzle 30 at the treatment position reaches the upper surface of the substrate W held on the spin chuck 20. Also, the pivot of the nozzle pedestal 33 enables the upper treatment solution nozzle 30 to rock above the holding surface 21a of the spin base 21.

The treatment unit 1 according to this embodiment further includes two upper treatment solution nozzles 60 and 65 in addition to the upper treatment solution nozzle 30. The upper treatment solution nozzles 60 and 65 according to this embodiment has the same configuration as that of the upper treatment solution nozzle 30. Specifically, the upper treatment solution nozzle 60 includes a discharge head attached to the distal end of the nozzle arm 62, and as indicated by an arrow AR64, is moved in an arc shape between the treatment position above the spin chuck 20 and the standby position outside the treatment cup 40 by a nozzle pedestal 63 connected to the proximal end of the nozzle arm 62. Similarly, the upper treatment solution nozzle 65 includes a discharge head attached to the distal end of the nozzle arm 67 and, as indicated by an arrow AR69, is moved in an arc shape between the treatment position above the spin chuck 20 and the standby position outside the treatment cup 40 by a nozzle pedestal 68 connected to the proximal end of the nozzle arm 67. The upper treatment solution nozzles 60 and 65 are also configured to be supplied with a plurality of treatment solutions at least including deionized water and discharge the treatment solutions to the upper surface of the substrate W held on the spin chuck 20. At least one of the upper treatment solution nozzles 60 and 65 may be a two-fluid nozzle that mixes a cleaning solution such as deionized water with a pressurized gas to produce a droplet, thereby emitting a mixed fluid of the droplet and the gas to the substrate W. The number of nozzles provided in the treatment unit 1 is not limited to three but may be one or more.

The treatment unit 1 includes a lower treatment solution nozzle 28 provided vertically so as pass through the rotating shaft 24. The upper-end opening of the lower treatment solution nozzle 28 is formed at such a position as to face the center of the lower surface of the substrate W held on the spin chuck 20. The lower treatment solution nozzle 28 is also configured to be supplied with a plurality of treatment solutions. The treatment solutions discharged from the lower treatment solution nozzle 28 reach the lower surface of the substrate W held on the spin chuck 20.

The treatment cup 40 surrounding the spin chuck 20 includes an inner cup 41, an intermediate cup 42, and an outer cup 43 that can ascend and descend independently. The inner cup 41 surrounds the spin chuck 20 and is shaped to be almost rotationally symmetric with respect to the rotational axis CX passing through the center of the substrate W held on the spin chuck 20. The inner cup 41 integrally includes a bottom 44 annular in plan view, a cylindrical inside wall portion 45 standing upward from the inner periphery of the bottom 44, a cylindrical outside wall portion 46 standing upward from the outer periphery of the bottom 44, a first guide portion 47 standing from between the inside wall portion 45 and the outside wall portion 46, with its upper end portion extending obliquely upward toward the center (in such a direction as to approach the rotational axis CX of the substrate W held on the spin chuck 20) while describing a smooth arc, and a cylindrical intermediate wall portion 48 standing upward from between the first guide portion 47 and the outside wall portion 46.

The inside wall portion 45 is formed to have such a length as to be accommodated with an appropriate spacing between the cover member 23 and itself and between the flange member 25 and itself while the inner cup 41 is raised most. The intermediate wall portion 48 is formed to have such a length as to be accommodated with an appropriate spacing between a second guide portion 52 of the intermediate cup 42 and itself and between a treatment solution separating wall 53 of the intermediate cup 42 and itself while the inner cup 41 and the intermediate cup 42 are in closest proximity. The second guide portion 52 and the treatment solution separating wall 53 are described below.

The first guide portion 47 has an upper end portion 47b extending obliquely upward toward the center (in such a direction as to approach the rotational axis CX of the substrate W) while describing a smooth arc. Between the inside wall portion 45 and the first guide portion 47 is a disposal groove 49 for collecting and disposing of the used treatment solution. Between the first guide portion 47 and the intermediate wall portion 48 is an annular inner recovery groove 50 for collecting and recovering the used treatment solution. Between the intermediate wall portion 48 and the outside wall portion 46 is an annular outer recovery groove 51 for collecting and recovering a treatment solution different from that of the inner recovery groove 50.

The disposal groove 49 is connected with a drainage mechanism (not shown) for draining the treatment solutions collected in the disposal groove 49 and forcibly evacuating the disposal groove 49. For example, four drainage mechanisms are provided equidistantly on the circumference of the disposal groove 49. The inner recovery groove 50 and the outer recovery groove 51 are connected with recovery mechanisms (which are not shown) for recovering the treatment solutions collected in the inner recovery groove 50 and the outer recovery groove 51 in a recovery tank provided outside the substrate treating apparatus 1. The bottoms of the inner recovery groove 50 and the outer recovery groove 51 are inclined to the horizontal direction by a minute angle and are connected with the recovery mechanisms at their lowest positions. This allows the treatment solutions flowing into the inner recovery groove 50 and the outer recovery groove 51 to be recovered smoothly.

The intermediate cup 42 surrounds the spin chuck 20 and is formed to be almost rotationally symmetric with respect to the rotational axis CX passing through the center of the substrate W held on the spin chuck 20. The intermediate cup 42 integrally includes the second guide portion 52 and a cylindrical treatment solution separating wall 53 connected with the second guide portion 52.

The second guide portion 52 includes, outside the first guide portion 47 of the inner cup 41, a lower end portion 52*a*, an upper end portion 52*b*, and a folded portion 52*c*. The lower end portion 52*a* forms a coaxial cylindrical shape with the lower end portion of the first guide portion 47. The upper end portion 52*b* extends obliquely upward (in such a direction as to approach the rotational axis CX of the substrate W) from the upper end of the lower end portion 52*a* while describing a smooth arc. The folded portion 52*c* is formed by downwardly folding back the distal end portion of the upper end portion 52*b*. The lower end portion 52*a* is accommodated in the inner recovery groove 50 with an appropriate spacing between the first guide portion 47 and itself and between the intermediate wall portion 48 and itself while the inner cup 41 and the intermediate cup 42 are in closest proximity. The upper end portion 52*b* is provided so as to vertically overlap the upper end portion 47*b* of the first guide portion 47 of the inner cup 41, and is in proximity to the upper end portion 47*b* of the first guide portion 47 with a minute spacing while the inner cup 41 and the intermediate cup 42 are in closest proximity. The folded portion 52*c* formed by downwardly folding back the distal end of the upper end portion 52*b* is formed to have such a length that the folded portion 52*c* horizontally overlaps the distal end of the upper end portion 47*b* of the first guide portion 47 while the inner cup 41 and the intermediate cup 42 are in closest proximity.

The upper end portion 52*b* of the second guide portion 52 is formed to be thicker toward its lower portion, and the treatment solution separating wall 53 has a cylindrical shape so as to extend downward from the lower outer edge of the upper end portion 52*b*. The treatment solution separating wall 53 is accommodated in the outer recovery groove 51 with an appropriate spacing between the intermediate wall portion 48 and itself and between the outer cup 43 and itself while the inner cup 41 and the intermediate cup 42 are in closest proximity.

The outer cup 43 surrounds the spin chuck 20 outside the second guide portion 52 of the intermediate cup 42 and has such a shape as to be almost rotationally symmetric with respect to the rotational axis CX passing through the center of the substrate W held on the spin chuck 20. The outer cup 43 functions as a third guide portion. The outer cup 43 includes a lower end portion 43*a*, an upper end portion 43*b*, and a folded portion 43*c*. The lower end portion 43*a* forms a coaxial cylindrical shape with the lower end portion 52*a* of the second guide portion 52. The upper end portion 43*b* extends obliquely upward (in such a direction as to approach the rotational axis CX of the substrate W) from the upper end of the lower end portion 43*a* while describing a smooth arc. The folded portion 43*c* is formed by downwardly folding back the distal end portion of the upper end portion 43*b*.

The lower end portion 43*a* is accommodated in the outer recovery groove 51 with an appropriate spacing between the treatment solution separating wall 53 of the intermediate cup 42 and itself and between the outside wall portion 46 of the inner cup 41 and itself while the inner cup 41 and the outer cup 43 are in closest proximity. The upper end portion 43*b* is provided so as to vertically overlap the second guide portion 52 of the intermediate cup 42, and is in proximity to the upper end portion 52*b* of the second guide portion 52 with a minute spacing while the intermediate cup 42 and the outer cup 43 are in closest proximity. The folded portion 43*c* formed by downwardly folding back the distal end of the upper end portion 43*b* is formed such that the folded portion 43*c* horizontally overlaps the folded portion 52*c* of the second guide portion 52 while the intermediate cup 42 and the outer cup 43 are in closest proximity.

The inner cup 41, the intermediate cup 42, and the outer cup 43 are configured to ascend and descend independently. Specifically, the inner cup 41, the intermediate cup 42, and the outer cup 43 are individually provided with an elevating mechanism (not shown), and are independently caused to ascend and descend. Such an elevating mechanism may be any of the various known mechanisms such as a ball screw mechanism and an air cylinder.

The divider 15 is provided so as to divide the inner space of the chamber 10 into upper and lower portions around the treatment cup 40. The divider 15 may be one plate-shaped member surrounding the treatment cup 40 or may be a plurality of plate-shaped members connected to each other. Alternatively, the divider 15 may have a through-hole penetrating the divider 15 or a cut-away part. In this embodiment, the divider 15 has through holes formed to cause the support shafts for supporting the nozzle pedestals 33, 63, and 68 of the upper treatment solution nozzles 30, 60, and 65 to pass therethrough.

The peripheral edge of the divider 15 is connected to the side wall 11 of the chamber 10. The edge portion of the divider 15 that surrounds the treatment cup 40 is formed into a circle having a radius larger than the outside diameter of the outer cup 43. The divider 15 accordingly does not interfere with the ascending/descending of the outer cup 43.

An exhaust duct 18 is provided in a part of the side wall 11 of the chamber 10 near the floor wall 13. The exhaust duct 18 is connected in communication with an exhaust mechanism (not shown). Of the cleaned air that is supplied from the fan filter unit 14 and flows downward in the chamber 10, the air passing through between the treatment cup 40 and the divider 15 is drained out of the apparatus through the exhaust duct 18.

Figure 4:
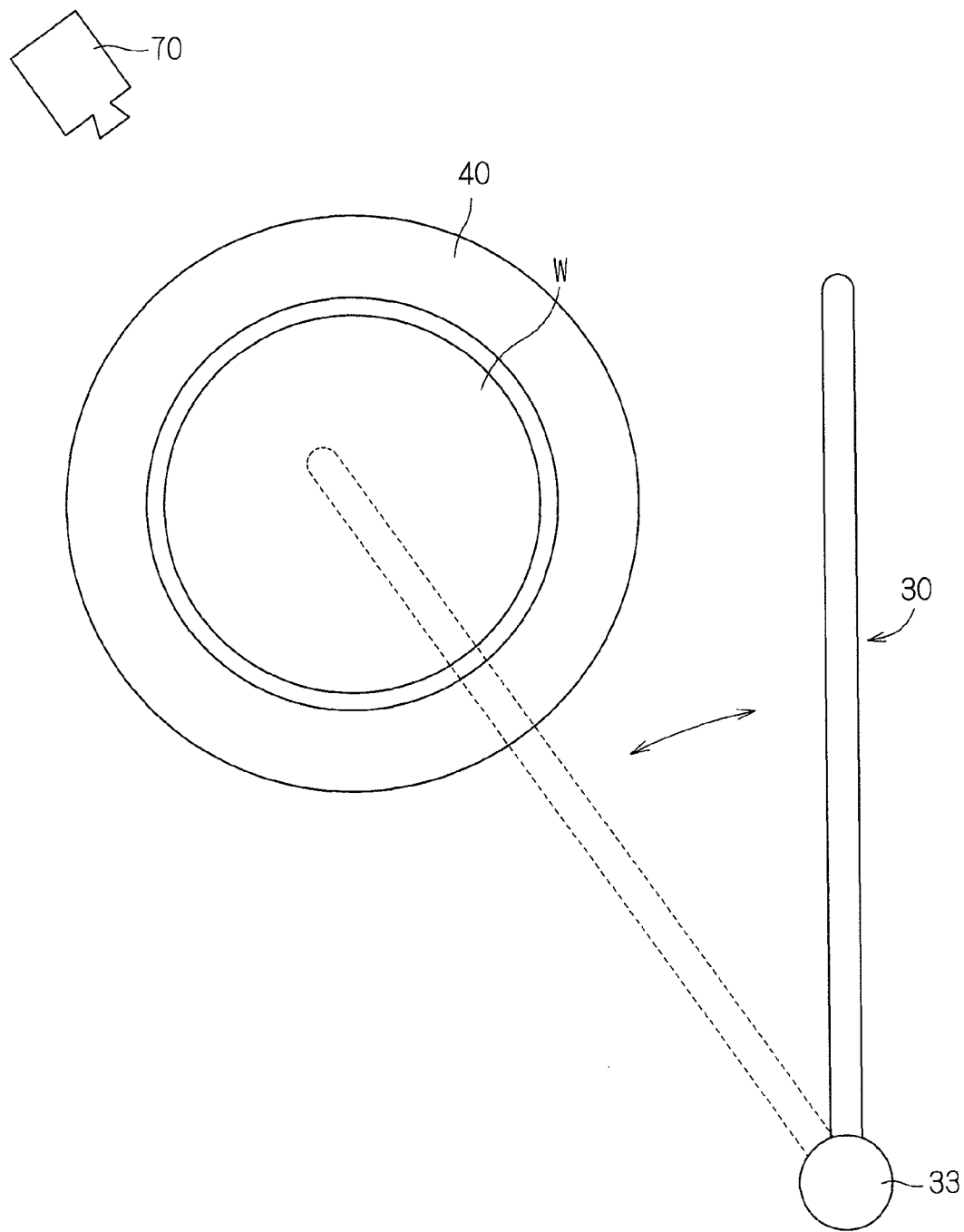
FIG. 4 shows the positional relationship between a camera and an upper treatment solution nozzle.

The camera 70 is provided above the divider 15 in the chamber 10. FIG. 4 shows the positional relationship between the camera 70 and the upper treatment solution nozzle 30. The camera 70 includes a CCD being one type of solid-state image sensing device and an optical system such as an electronic shutter and a lens. The upper treatment solution nozzle 30 is moved reciprocally by the nozzle pedestal 33 between the treatment position (the dotted line position of FIG. 4) above the substrate W held on the spin chuck 20 and the standby position (the solid line position of FIG. 4) outside the treatment cup 40. The treatment position is a position at which the upper treatment solution nozzle 30 discharges a treatment solution to the upper surface of the substrate W held on the spin chuck 20 for a liquid treatment. The standby position is a position at which the upper treatment solution nozzle 30 stops discharging the treatment solution and is on standby when it does not perform the liquid treatment. At the standby position may be provided a standby pod for accommodating the discharge head 31 of the upper treatment solution nozzle 30.

The camera 70 is placed such that its imaging field of view includes at least an area in which a liquid fluid of the treatment solution is to be formed when the upper treatment solution nozzle 30 discharges the treatment solution at the treatment position, that is, is placed at a position at which its imaging field of view includes the portion below the discharge head 31 of the upper treatment solution nozzle 30. The camera 70 is placed at a position at which its field of view includes an area, being a part of the surface of the substrate W held on the spin chuck 20, different from the area in which the liquid flow is to be formed. In this embodiment, as shown in FIG. 4, the camera 70 is placed at a position at which the upper treatment solution nozzle 30 is imaged from the front thereof and thereabove. The camera 70 can accordingly image an imaging area including an area in which a liquid flow of the treatment solution is to be formed when the upper treatment solution nozzle 30 discharges the treatment solution at the treatment position and also including an area, being a part of the surface of the substrate W held on the spin chuck 20, different from the area in which the liquid flow is to be formed.

Similarly, the camera 70 can image an imaging area including an area at which a liquid flow of the treatment solution is to be formed when the upper treatment solution nozzles 60 and 65 discharge the treatment solution at the treatment position and also including an area, being a part of the surface of the substrate W held on the spin chuck 20, different from the area in which the liquid flow is to be formed. When the camera 70 is placed at the position as shown in FIGS. 2 and 4, the upper treatment solution nozzles 30 and 60 move laterally in the imaging field of view of the camera 70, and accordingly can image a movement near the treatment position. Meanwhile, the upper treatment solution nozzle 65 moves depthwise in the imaging field of view of the camera 70, and thus, may fail to appropriately image a movement near the treatment position. In such a case, a camera dedicated to the upper treatment solution nozzle 65 may be provided separately from the camera 70.

As shown in FIG. 3, a lighting part 71 is provided above the divider 15 in the chamber 10. The chamber 10 is normally a dark room, and thus, the lighting part 71 irradiates the upper treatment solution nozzles 30, 60, and 65 near the treatment position with light during imaging by the camera 70.

Figure 5:
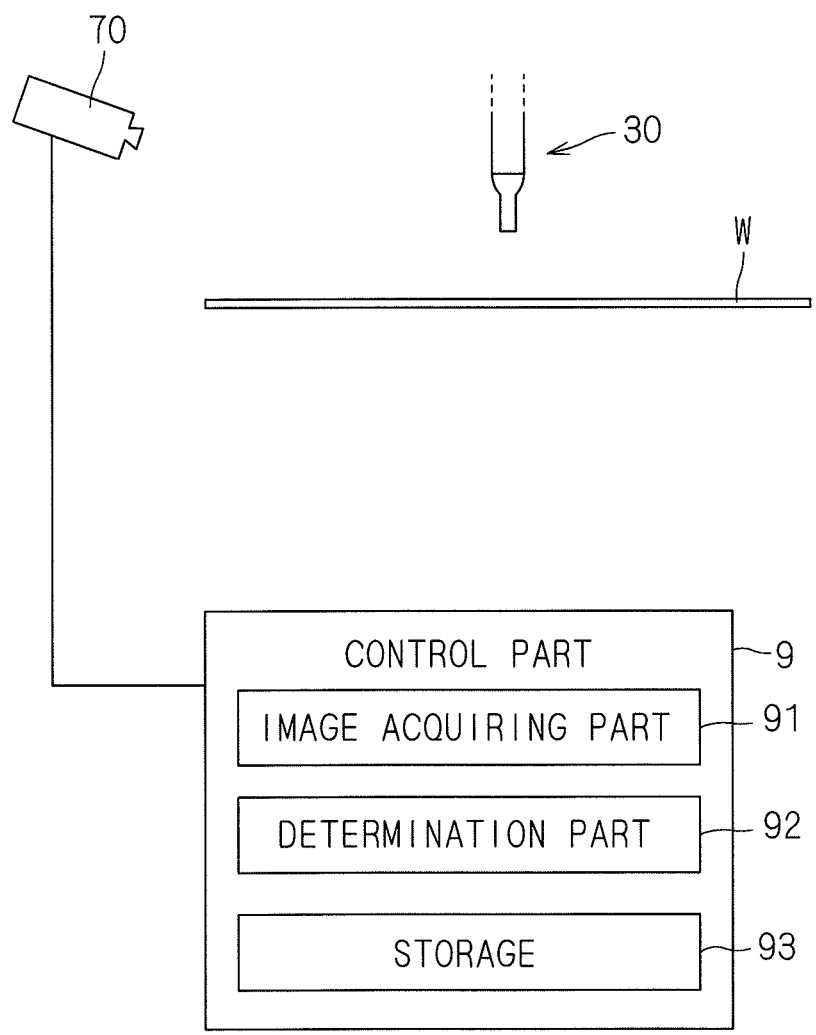
FIG. 5 is a block diagram of the camera and a control part.

FIG. 5 is a block diagram of the camera 70 and the control part 9. The hardware configuration of the control part 9 provided in the substrate treating apparatus 100 is similar to that of a general-purpose computer. Specifically, the control part 9 includes a CPU that performs various calculations, a ROM being a read-only memory for storing a basic program, a RAM being a readable/writable memory that stores various types of information, and a magnetic disk that stores control software, data, and the like. By the CPU of the control part 9 executing a predetermined processing program, the control part 9 controls each operational mechanism of the substrate treating apparatus 100, so that the treatment in the substrate treating apparatus 100 advances.

An image acquiring part 91 and a determination part 92 shown in FIG. 5 are function processing parts implemented in the control part 9 by the CPU of the control part 9 executing a predetermined processing program. The image acquiring part 91 trims the image captured by the camera 70 to acquire partial images, which is specifically described below. The determination part 92 compares the partial images acquired by the image acquiring part 91 to determine a discharge of the treatment solution. A storage 93 of the control part 9, which is configured as the RAM or magnetic disc, stores the data of an image captured by the camera 70 and an input value.

The following describes the operation in the substrate treating apparatus 100 having the above-mentioned configuration. The normal procedure of treating the substrate W in the substrate treating apparatus 100 is as follows: the main transfer robot 103 carries an untreated substrate W received from the indexer 102 into the treatment unit 1, the treatment unit 1 supplies a treatment solution to the substrate W for a surface treatment, and then, the main transfer robot 103 carries the treated substrate W out of the treatment unit 1 and then returns the substrate W to the indexer 102. The outline of the typical procedure of treating the substrate W in each treatment unit 1 is as follows: a chemical solution is supplied to the surface of the substrate W for a predetermined chemical solution treatment, deionized water is supplied for a rinse treatment, and then, the substrate W is rotated at high speed for a drying treatment.

When the treatment unit 1 treats the substrate W, the spin chuck 20 holds the substrate W, and the treatment cup 40 ascends and descends. When a chemical solution treatment is performed, for example, only the outer cup 43 ascends, and an opening surrounding the substrate W held on the spin chuck 20 is formed between the upper end portion 43b of the outer cup 43 and the upper end portion 52b of the second guide portion 52 of the intermediate cup 42. The substrate W is rotated with the spin chuck 20 in this state, and the upper treatment solution nozzle 30 and/or the lower treatment solution nozzle 28 supplies a chemical solution to the upper surface and/or the lower surface of the substrate W. The supplied chemical solution flows along the upper surface and/or the lower surface of the substrate W by the centrifugal force caused by the rotation of the substrate W, and is eventually dispersed from the edge portion of the substrate W toward its side. This advances the chemical solution treatment for the substrate W. The chemical solution dispersed from the edge portion of the rotating substrate W is received by the upper end portion 43b of the outer cup 43, flows down along the inner surface of the outer cup 43, and is recovered in the outer recovery groove 51.

When a rinse treatment is performed, for example, all of the inner cup 41, the intermediate cup 42, and the outer cup 43 ascend, and the first guide portion 47 of the inner cup 41 surrounds the substrate W held on the spin chuck 20. In this state, the substrate W is rotated with the spin chuck 20, and the upper treatment solution nozzle 30 and the lower treatment solution nozzle 28 supply deionized water to the upper surface and the lower surface of the substrate W. The supplied water flows along the upper surface and the lower surface of the substrate W by the centrifugal force caused by the rotation of the substrate W and is eventually dispersed from the edge portion of the substrate W toward its side. This advances the rinse treatment for the substrate W. The water dispersed from the edge portion of the rotating substrate W flows down along the inner wall of the first guide portion 47 and is drained out of the disposal groove 49. In the case where water is recovered in a path different from that of the chemical solution, the intermediate cup 42 and the outer cup 43 may be raised so that an opening surrounding the substrate W held on the spin chuck 20 may be formed between the upper end portion 52b of the second guide portion 52 of the intermediate cup 42 and the upper end portion 47b of the first guide portion 47 of the inner cup 41.

When a draining and drying treatment is performed, all of the inner cup 41, the intermediate cup 42, and the outer cup 43 descend, so that all of the upper end portion 47b of the first guide portion 47 of the inner cup 41, the upper end portion 52b of the second guide portion 52 of the intermediate cup 42, and the upper end portion 43b of the outer cup 43 are located below the substrate W held on the spin chuck 20. In this state, the substrate W is rotated at high speed with the spin chuck 20, and the waterdrop adhering to the substrate W is drained by centrifugal force, so that the drying treatment is performed.

In this embodiment, when the upper treatment solution nozzle 30 discharges a treatment solution to the upper surface of the substrate W, the image acquiring part 91 and the determination part 92 perform a predetermined image processing on the image obtained through imaging by the camera 70, thereby determining the presence or absence of a discharge of the treatment solution. The technique for the above is described below. Although description is given of the determination of a discharge of the treatment solution from the upper treatment solution nozzle 30, the same holds true for the other upper treatment solution nozzles 60 and 65.

Figure 6:
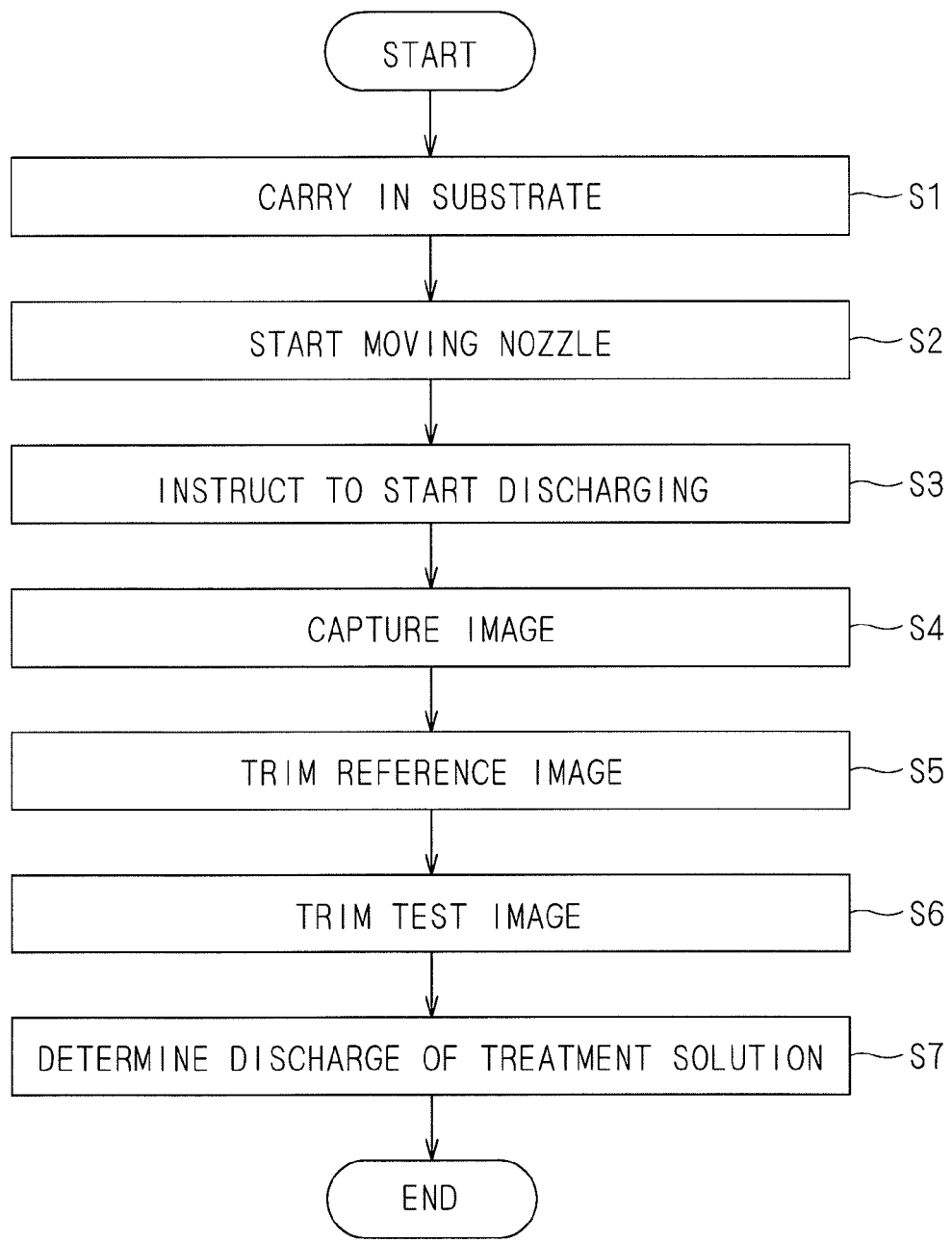
FIG. 6 is a flowchart showing the procedure of determining a discharge of a treatment solution.

FIG. 6 is a flowchart showing the procedure of determining a discharge of the treatment solution. First, a to-be-treated substrate W is carried into the treatment unit 1 by the main transfer robot 103 (Step S1). The carried substrate W is held horizontally on the spin chuck 20. Simultaneously, the treatment cup 40 ascends/descends so as to reach a predetermined height.

After a to-be-newly-treated substrate W is held on the spin chuck 20, the spin motor 22 starts rotating the spin chuck 20 and the substrate W under the control of the control part 9, and simultaneously, the upper treatment solution nozzle 30 starts moving from the standby position to the treatment position (Step S2). The upper treatment solution nozzle 30 is moved by the control part 9 controlling the nozzle pedestal 33 in accordance with a predetermined recipe (that describes the treatment procedure and condition of the substrate W).

Then, the control part 9 instructs the upper treatment solution nozzle 30 to start discharging the treatment solution in accordance with the recipe (Step S3). Although the upper treatment solution nozzle 30 typically starts discharging the treatment solution after the upper treatment solution nozzle 30 reaches the treatment position above the substrate W and then stops, the upper treatment solution nozzle 30 may start discharging the treatment solution while moving before reaching the treatment position.

The control part 9 causes the camera 70 to capture an image after instructing a discharge of the treatment solution (Step S4). The camera 70 can capture an image at any timing after the upper treatment solution nozzle 30 is instructed to start discharging a treatment solution as long as it is after the upper treatment solution nozzle 30 reaches the treatment position and then stops. The stop of the upper treatment solution nozzle 30 may be determined from the recipe, detected by an encoder provided to the nozzle pedestal 33, or determined from the monitoring results by the camera 70.

Figure 7:
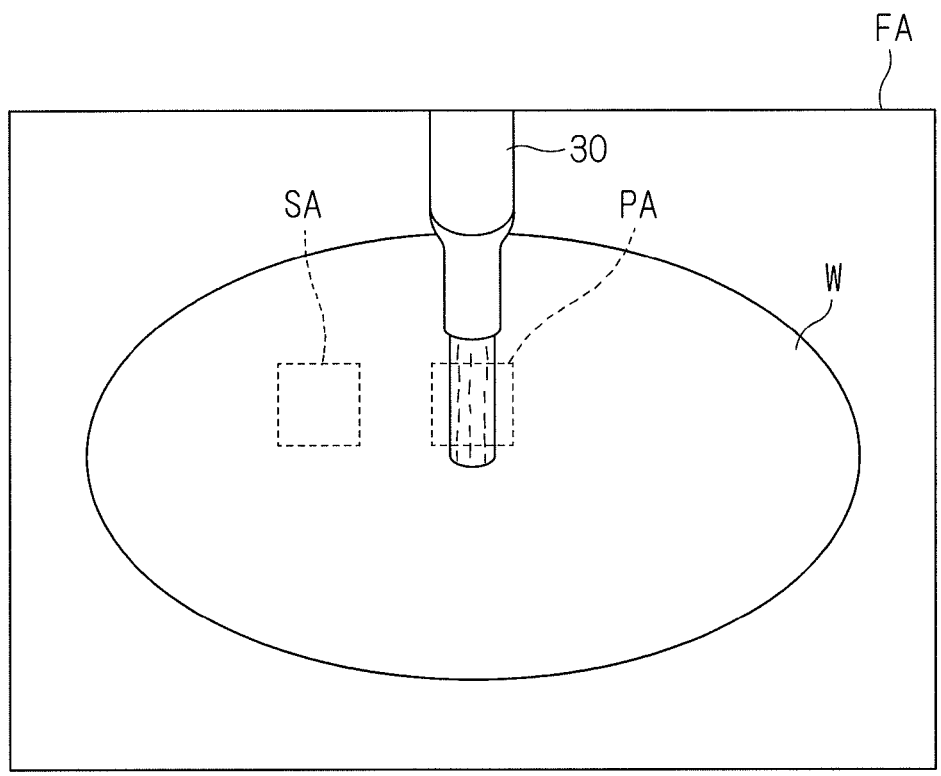
FIG. 7 shows an example image captured by the camera.

FIG. 7 shows an example image captured by the camera 70. The camera 70 images an imaging area including an area in which a liquid flow of a treatment solution is to be formed when the upper treatment solution nozzle 30 discharges the treatment solution at the treatment position and also including an area, being a part of the surface of the substrate W held on the spin chuck 20, different from the area in which a liquid flow is to be formed. The imaging area of the camera 70 in this embodiment includes, as shown in FIG. 7, the entire surface of the substrate W held on the spin chuck 20.

Thus, the imaging area of the camera 70 also includes an area in which a liquid flow of the treatment solution is to be formed when the upper treatment solution nozzle 30 discharges the treatment solution at the treatment position above the substrate W. Meanwhile, the imaging area of the camera 70 naturally includes an area, being a part of the surface of the substrate W, different from the area in which the liquid flow is to be formed. The storage 93 of the control part 9 sores the data of an image FA captured by the camera 70, which is shown in FIG. 7.

Next, the image acquiring part 91 of the control part 9 cuts out a reference image SA from the image FA captured by the camera 70 (Step S5). The reference image SA is an image of an area of the surface of the substrate W held on the spin chuck 20 except for the area in which a liquid flow of the treatment solution from the upper treatment solution nozzle 30 is to be formed. For example, as shown in FIG. 7, the reference image SA may be an image of an area of the surface of the substrate W, which is lateral to the area in which the liquid flow of the treatment solution from the upper treatment solution nozzle 30 is to be formed. The image acquiring part 91 trims the image FA captured by the camera 70 and stored in the storage 93, and then cuts out the reference image SA. More specifically, the coordinates of the surface area of the substrate W and the area in which a liquid flow of the treatment solution from the upper treatment solution nozzle 30 is to be formed are determined in the image FA captured by the camera 70. Thus, the coordinates of the area lateral to the area in which the liquid flow is to be formed may be set in advance, and the image acquiring part 91 may trim the area whose coordinates have been set. The storage 93 of the control part 9 stores the data of the reference image SA trimmed by the image acquiring part 91.

Subsequently, the image acquiring part 91 of the control part 9 cuts out a test image PA from the image FA captured by the camera 70 (Step S6). The test image PA is an image of the surface of the substrate W held on the spin chuck 20, which includes an area in which a liquid flow of the treatment solution from the upper treatment solution nozzle 30 is to be formed. The size of the test image PA is identical to the size of the reference image SA. The image acquiring part 91 trims the image FA captured by the camera 70 and stored in the storage 93 to cut out the test image PA. More specifically, the coordinates of the area in which a liquid flow of the treatment solution from the upper treatment solution nozzle 30 is to be formed are determined in the image FA captured by the camera 70, and thus, the image acquiring part 91 is only required to trim the area of those coordinates. The storage 93 of the control part 9 stores the data of the test image PA trimmed by the image acquiring part 91.

Although FIG. 6 shows that the test image PA is trimmed after the reference image SA is trimmed, the order of the trimming is not particularly limited. The reference image SA may be trimmed after the test image PA is trimmed, or both the images may be trimmed simultaneously. Both the reference image SA and the test image PA can be said to be cut out from the common image FA and captured simultaneously, independent of the order of trimming.

Then, the determination part 92 of the control part 9 compares the reference image SA and the test image PA to determine a discharge of the treatment solution from the upper treatment solution nozzle 30 (Step S7). For example, this determination may be performed as follows. The determination part 92 adds up, for all of the pixels included in the reference image SA, an absolute value of the difference between the gradation value of each pixel of the reference image SA and the gradation value of the corresponding pixel of the test image PA. Specifically, the determination part 92 calculates a total sum of the absolute values of the differences between the gradation values of the pixels constituting the reference image SA and the gradation values of the corresponding pixels constituting the test image PA.

Subsequently, the determination part 92 compares the total of the differences calculated as described above with a predetermined threshold set in advance and stored in the storage 93. Then, for a total sum of the differences equal to or more than the threshold, the determination part 92 determines that the upper treatment solution nozzle 30 has discharged a treatment solution. Meanwhile, for a total sum of the differences smaller than the threshold, the determination part 91 determines that the upper treatment solution nozzle 30 has discharged no treatment solution. When determining that no treatment solution has been discharged even after an instruction is provided to start discharging a treatment solution, an abnormal discharge of the treatment solution is conceivable. Thus, for example, a display provided in the control part 9 may display an error. When an abnormal discharge of the treatment solution from the upper treatment solution nozzle 30 is determined, the control part 9 may address the abnormality, for example, stop the treatment.

The determination for the upper treatment solution nozzle 30 has been described above. In using the upper treatment solution nozzle 60 or 65, determination can be made for the upper treatment solution nozzle 60 or the upper treatment solution nozzle 65 in a procedure similar to that of FIG. 6.

In this embodiment, the reference image SA and the test image PA are cut out from one image FA captured by the camera 70 after the upper treatment solution nozzle 30 receives an instruction to start discharging a treatment solution. The test image PA is an image including an area of the surface of the substrate W held on the spin chuck 20, in which a liquid flow of the treatment solution from the upper treatment solution nozzle 30 is to be formed. Meanwhile, the reference image SA is an image of an area of the surface of the substrate W held on the spin chuck 20 except for the area in which the liquid flow of the treatment solution from the upper treatment solution nozzle 30 is to be formed. In other words, the reference image SA and the test image PA are acquired at the same timing for different areas of the surface of the substrate W held on the spin chuck 20.

The substrate W whose surface is reflected in the test image PA as its background is identical to the substrate W included in the reference image SA. For a difference between the reference image SA and the test image PA, the influence of the type or pattern of the film formed on the surface of the substrate W is eliminated irrespective of the magnitude of the surface reflectance attributable to the type or pattern of the film. This enables reliable detection of a discharge of the treatment solution from the upper treatment solution nozzle 30 through comparison between the reference image SA and the test image PA independent of the type of a to-be-treated substrate W.

It is conceivable here that a reference image being the reference for comparison may be an image capturing the same area as the test image PA before the upper treatment solution nozzle 30 starts discharging the treatment solution. This eliminates the influence of the type or pattern of the film formed on the surface of the substrate W because the reference image and the test image capture the same area of the same substrate W. In the case where, for example, the upper treatment solution nozzle 30 discharges hydrogen fluoride as a treatment solution for etching the film formed on the surface of the substrate W, however, the surface state of the substrate W varies with the advancement of the etching as well as the corrosion of the film. This results in varying surface reflectance or the like even for the same substrate W. Consequently, the variations become background noise in the comparison between the reference image and the test image, which may hinder the accurate determination of a discharge of the treatment solution.

This embodiment acquires the reference image SA and the test image PA of the same substrate W at the same timing. If the details of the treatment relate to the etching using hydrogen fluoride and the surface state of the substrate W varies with the advancement of the treatment, accordingly, an influence of the change can be eliminated. Consequently, independent of the type of a to-be-treated substrate W and the details of the treatment, a discharge of the treatment solution from the upper treatment solution nozzle 30 can be detected reliably.

In this embodiment, both of the reference image SA and the test image PA are acquired after the upper treatment solution nozzle 30 receives an instruction to start discharging the treatment solution. Specifically, the reference image SA needs not to be acquired before the upper treatment solution nozzle 30 starts discharging the treatment solution. In the case where a reference image needs to be acquired before the upper treatment solution nozzle 30 starts discharging a treatment solution, the timing of capturing a reference image is strictly limited. For example, in the case where a discharge of the treatment solution is started before the nozzle stops, a reference image per se cannot be acquired. Therefore, the reference image SA can be reliably acquired even after the upper treatment solution nozzle 30 starts discharging the treatment solution.

Second Embodiment

The following describes a second embodiment of the present invention. The configuration of the substrate treating apparatus of the second embodiment is the same as that of the first embodiment. Although the procedure of treating the substrate W in the second embodiment is the same as that of the first embodiment, the second embodiment performs a plurality of determinations to determine the presence or absence of a discharge of the treatment solution.

In the second embodiment, after the upper treatment solution nozzle 30 receives an instruction to start discharging the treatment solution, the camera 70 images the same imaging area as that of the first embodiment a plurality of times to acquire a plurality of images FA. Then, the image acquiring part 91 of the control part 9 cuts out the reference image SA and the test image PA from the plurality of images FA captured by the camera 70. The areas of the reference image SA and the test image PA cut out from each of the images FA are the same as those of the first embodiment.

Then, the determination part 92 of the control part 9 compares the reference image SA and the test image PA cut out from each of the plurality of images FA by the image acquiring part 91 to determine a discharge of the treatment solution from the upper treatment solution nozzle 30. The determination through comparison between the reference image SA and the test image PA per image FA is the same as that of the first embodiment.

The second embodiment determines an abnormal discharge of the treatment solution when determining that the upper treatment solution nozzle 30 has not discharged the treatment solution even once after a plurality of determinations of the presence or absence of a discharge of the treatment solution from the upper treatment solution nozzle 30. Therefore, if a discharge of the treatment solution that has been started may be interrupted due to any factor, the interruption can be detected reliably.

Third Embodiment

The following describes a third embodiment of the present invention. The configuration of the substrate treating apparatus of the third embodiment is the same as that of the first embodiment. Although the procedure of treating the substrate W in the third embodiment is the same as that of the first embodiment, in the third embodiment, two reference images are cut out from different areas of the image FA captured by the camera 70, thereby verifying the validity of the determination of a discharge of the treatment solution.

Figure 8:
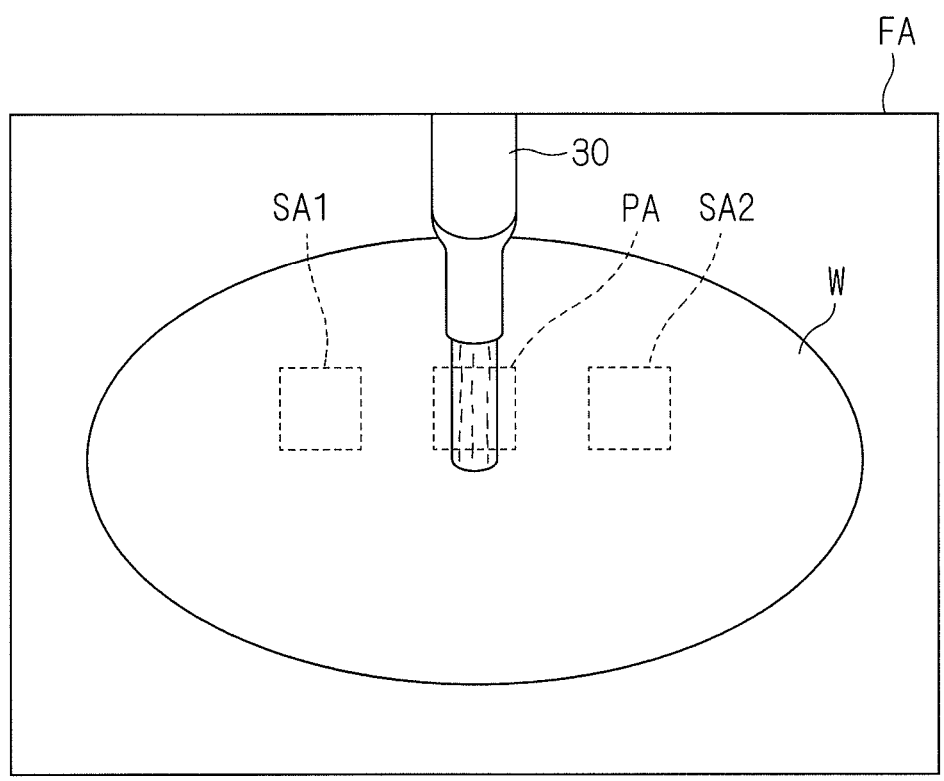
FIG. 8 shows another example image captured by the camera.

FIG. 8 shows another example image captured by the camera 70. The imaging area of the camera 70 in the third embodiment is the same as that of the first embodiment, which includes the entire surface of the substrate W held on the spin chuck 20. In the third embodiment, the image acquiring part 91 of the control part 9 cuts out two reference images, namely, the first reference image SA1 and the second reference image SA2, from the image FA captured by the camera 70. The first reference image SA1 may be, for example, the image of the same area as that of the reference image SA in the first embodiment. The second reference image SA2 is an image of an area of the surface of the substrate W held on the spin chuck 20 except for the area in which a liquid flow of the treatment solution from the upper treatment solution nozzle 30 is to be formed, which is an image of an area different from that of the first reference image SA1. For example, as shown in FIG. 8, the second reference image SA2 may be an image of the area opposite to the first reference image SA1, with the area of the surface of the substrate W, in which a liquid flow of the treatment solution from the upper treatment solution nozzle 30 is to be formed, sandwiched between these reference images.

The image acquiring part 91 cuts out the test image PA from the image FA captured by the camera 70 as in the first embodiment. Specifically, the test image PA is an image including the area of the surface of the substrate W held on the spin chuck 20, in which a liquid flow of the treatment solution from the upper treatment solution nozzle 30 is to be formed. All of the first reference image SA1, the second reference image SA2, and the test image PA are cut out from a common image FA and captured at the same time.

In the third embodiment, the determination part 92 of the control part 9 compares the first reference image SA1 (or the second reference image SA2) and the test image PA and also compares the first reference image SA1 and the second reference image SA2. A discharge of the treatment solution from the upper treatment solution nozzle 30 is determined through the comparison between the first reference image SA1 and the test image PA as in the first embodiment.

In the third embodiment, the determination part 92 further compares the first reference image SA1 and the second reference image SA2 to determine the validity of the determination of a discharge of the treatment solution. Both of the first reference image SA1 and the second reference image SA2 are the images of the area of the surface of the substrate W held on the spin chuck 20 except for the area in which a liquid flow of the treatment solution from the upper treatment solution nozzle 30 is to be formed. As long as the camera 70 properly captures the image FA and the image acquiring part 91 properly cuts out the first reference image SA1 and the second reference image SA2, accordingly, the first reference image SA1 should be identical to the second reference image SA2.

If a difference is found between the first reference image SA1 and the second reference image SA2 as a result of the comparison of the reference images by the determination part 92, it is conceivable that an abnormality may occur in at least any one of the first reference image SA1 and the second reference image SA2 and that the abnormal reference image may be accordingly unsuitable as a reference image. If any difference is found between the first reference image SA1 and the second reference image SA2, the determination part 92 determines that the reference image per se is unsuitable and invalidates the determination of a discharge of the treatment solution through the comparison between the first reference image SA1 (or the second reference image SA2) and the test image PA. In this case, the determination part 92 may signal an error different from that for an abnormal discharge of the treatment solution.

The third embodiment cuts out two reference images from different areas of the image FA captured by the camera 70 to verify the validity of the determination of a discharge of the treatment solution, and thus, can improve the accuracy of detecting a discharge of the treatment solution from the upper treatment solution nozzle 30.

<Modifications>

While the embodiments of the invention have been described, numerous other modifications and variations can be devised without departing from the scope of the invention. For example, in the first embodiment, the reference image SA is the image of the area lateral to the area in which a liquid flow of the treatment solution from the upper treatment solution nozzle 30 is to be formed. Alternatively, the reference image SA can be an image of an appropriate area of the surface of the substrate W except for the area in which a liquid flow of the treatment solution from the upper treatment solution nozzle 30 is to be formed.

While the first embodiment cuts out the reference image SA and the test image PA from the image FA captured by one camera 70, a plurality of cameras may be provided to individually capture the reference image SA and the test image PA at the same timing. Needless to say, imaging results may differ due to a minute difference of the camera if the same area is imaged. Thus, as in each of the embodiments, a reference image and a test image are preferably cut out from the image FA captured by one camera 70.

The substrates to be treated by the substrate treating apparatus 100 are not limited to the substrates for semiconductors and may be substrates for solar cells or glass substrates for flat panel displays such as liquid crystal display.

The technology according to the present invention is applicable to any apparatus that discharges a treatment solution to a substrate from a nozzle for a predetermined treatment. For example, the technology according to the present invention is applicable to a cleaning apparatus that discharges a cleaning solution to a rotating substrate from a nozzle for cleaning, a spin coater that discharges a photoresist solution to a rotating substrate from a nozzle for application of a resist, an apparatus that discharges a film removing liquid from a nozzle to the edge of the substrate having a film deposited on its surface, or an apparatus that discharges an etching solution to the surface of a substrate from a nozzle.

While the invention has been described in detail, the foregoing description is in all aspects illustrative and not restrictive. It is understood that numerous other modifications and variations can be devised without departing from the scope of the invention.

What is claimed is:

1. A substrate treatment method for discharging a treatment solution to a substrate, said method comprising the steps of:
    (a) holding a to-be-newly-treated substrate on a substrate holder;
    (b) moving, after the to-be-newly-treated substrate is held on said substrate holder, a nozzle that discharges a treatment solution from a standby position outside a cup surrounding said substrate holder toward a treatment position above the substrate held on said substrate holder;
    (c) imaging, after said nozzle receives an instruction to start discharging the treatment solution, an imaging area including an area in which a liquid flow is to be formed when said nozzle discharges the treatment solution at said treatment position;
    (d) cutting out, from an image acquired in said step (c), a test image and a first reference image, said test image being an image including the area of the surface of the substrate held on the substrate holder in which said liquid flow is to be formed, said first reference image being an image of the surface of the substrate except for said area; and
    (e) comparing said first reference image and said test image to determine a discharge of the treatment solution from said nozzle.

2. The substrate treatment method according to claim 1, wherein
    said step (c) images said imaging area a plurality of times after said nozzle receives an instruction to start discharging the treatment solution to acquire a plurality of images,
    said step (d) cuts out said first reference image and said test image from each of said plurality of images, and
    said step (e) compares said first reference image and said test image cut out in said step (d) for each of said plurality of images.

3. The substrate treatment method according to claim 1, wherein
    said step (d) further cuts out, from the image acquired in said step (c), a second reference image of an area of the surface of the substrate held on said substrate holder except for the area in which said liquid flow is to be formed, said second reference image differing from said first reference image, and
    said step (e) compares said first reference image and said second reference image to determine the validity of the determination of a discharge of the treatment solution.

* * * * *